(12) United States Patent
Hammond, IV et al.

(10) Patent No.: US 8,017,526 B2
(45) Date of Patent: Sep. 13, 2011

(54) GATE PROFILE CONTROL THROUGH EFFECTIVE FREQUENCY OF DUAL HF/VHF SOURCES IN A PLASMA ETCH PROCESS

(75) Inventors: Edward P. Hammond, IV, Hillsborough, CA (US); Rodolfo P. Belen, San Francisco, CA (US); Alexander M. Paterson, San Jose, CA (US); Brian K. Hatcher, San Jose, CA (US); Valentin N. Todorow, Palo Alto, CA (US); Dan Katz, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 915 days.

(21) Appl. No.: 11/998,829

(22) Filed: Nov. 30, 2007

(65) Prior Publication Data

US 2009/0142930 A1    Jun. 4, 2009

(51) Int. Cl.
*H01L 21/302*   (2006.01)

(52) U.S. Cl. .......... 438/714; 438/10; 438/706; 438/710; 156/345.48

(58) Field of Classification Search .................. 438/7, 9, 438/706, 710, 712, 714; 156/345.44, 48
See application file for complete search history.

(56) References Cited

U.S. PATENT DOCUMENTS

| 2003/0029835 A1* | 2/2003 | Yauw et al. | 216/67 |
| 2006/0118518 A1* | 6/2006 | Rusu et al. | 216/67 |
| 2007/0049042 A1* | 3/2007 | Chen et al. | 438/758 |

* cited by examiner

*Primary Examiner* — Lan Vinh
(74) *Attorney, Agent, or Firm* — Robert M. Wallace

(57) ABSTRACT

A method of processing a wafer in a plasma, in which target values of two different plasma process parameters are simultaneously realized under predetermined process conditions by setting respective power levels of VHF and HF power simultaneously coupled to the wafer to respective optimum levels.

17 Claims, 10 Drawing Sheets

GATE PROFILE CONTROL THROUGH EFFECTIVE FREQUENCY OF DUAL HF/VHF SOURCES IN A PLASMA ETCH PROCESS

TECHNICAL FIELD

The disclosure concerns a reactive ion etch process carried out in a plasma reactor for forming field effect transistors (FET's) having polycrystalline silicon ("polysilicon") gates over a thin gate dielectric on a semiconductor substrate.

BACKGROUND

Control of the polysilicon gate profile during FET fabrication is necessary to maintain the final gate length, a vital parameter that impacts FET performance. While the profile can be affected by subsequent etch processing steps, the profile is determined mainly during the etching of the polysilicon gate material. The gate etch process typically uses inductively coupled plasma (ICP) to obtain a certain plasma density. The process also employs a radio-frequency (RF) bias power that generates a DC bias voltage (VDC) across the plasma sheath which accelerates ions from the plasma onto the wafer.

The gate profile formed during reactive ion etching affects the gate length and depends to a large extent on the process chemistry and the RF power levels used to generate the plasma and accelerate ions that bombard the wafer. For example, addition of a passivating species, such as oxygen, will lead to more tapered profiles due to the faster accumulation of passivated film on the sidewall of the gate. On the other hand, addition of an etching gas like chlorine will reduce the amount of passivation on the sidewall. If the inductive power deposition is increased, this tends to generate a higher plasma density and increase the dissociation of passivating species that may be in the plasma, which leads to a less tapered/more re-entrant profile. If the RF bias power is increased, more etch by-product species are sputtered from the mask and silicon surfaces and end up redeposited on the sidewall of the gate, which leads to a more tapered profile.

The inductively coupled plasma with an HF bias can provide reasonable profile control. However, use of inductively coupled power can make it difficult to maintain a uniform profile across the entire wafer. This is because an inductively coupled plasma tends to concentrate directly beneath the coils of the inductively coupled RF power applicator or antenna. Due to the intense plasma generation directly beneath the coils, plasma ion density distribution is non-uniform and tends to follow the pattern of the coil antenna. This problem can be mitigated by increasing the gap between the coil antenna and the wafer or by decreasing the pressure, but these actions impose additional constraints on the process, limiting, for example, permitted variation in process gas flow that can be used to control the gate critical dimension (CD).

SUMMARY

A method in accordance with a first embodiment is provided for processing a wafer in a plasma reactor. The method comprises placing the wafer on a wafer support surface in a chamber of the reactor, introducing a process gas into the chamber, and establishing a predetermined set of process conditions including chamber pressure and flow rates of constituents of the process gas. HF power and VHF power are coupled simultaneously to the wafer. The method further comprises setting the level of the HF power and the level of the VHF power to respective optimum levels at which a first process parameter is at a first target value and a second process parameter is at a second target value. The first and second process parameters can be either: (a) plasma ion density in the chamber and plasma ion energy at the wafer surface, respectively, or (b) etch rate and critical dimension, respectively.

A method in accordance with a second embodiment is provided for processing a wafer in a plasma reactor. The method comprises placing the wafer on a wafer support surface in a chamber of the reactor, introducing a process gas into the chamber, and establishing a predetermined set of process conditions including chamber pressure and flow rates of constituents of the process gas. HF power and VHF power are simultaneously coupled to the wafer while RF coil power is coupled to a coil antenna overlying a ceiling of the chamber facing the wafer. The method further comprises setting the levels of the HF power, the VHF power and the RF coil power to respective optimum levels at which a first process parameter is at a first target value and a second process parameter is at a second target value. The first and second process parameters can be either: (a) plasma ion density in the chamber and plasma ion energy at the wafer surface, respectively, or (b) etch rate and critical dimension, respectively.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Introduction:

In a plasma reactor for processing a workpiece such as a semiconductor wafer, VHF power along with HF bias power is applied to the reactor cathode. The application of these powers can open up the process window by providing another means of generating plasma. It can either complement an inductively generated plasma or replace it. When the VHF power is applied simultaneously with the HF bias power through the same electrode, their combined action is equivalent to a bias power at an effective frequency between the VHF and HF, the effective frequency depending upon the relative power levels of the HF and VHF power. By adjusting this effective frequency, tradeoffs can be made between the ion energy and plasma/etching radical density. For a fixed bias power, the HF bias (at 13.56 MHz, for example) creates a low density plasma but accelerates the ions to high energy due to the high VDC; the VHF bias (at 60 MHz) has high plasma density and low ion energy.

In principle, plasma density and plasma bias voltage (VDC) can be measured as a function of bias power for various radio frequencies. The process on the wafer depends on many other factors besides plasma density and VDC, but they are among the most dominant. Thus, if they match between processes, along with other bulk parameters such as gas flow rates, pressure, and process volume (gap), then the processes should match. When a desirable process is obtained with a single frequency at a particular power, that power corresponds to a specific density and VDC. By choosing suitable power levels of higher and lower frequency RF powers applied simultaneously to the cathode, both the ion density and the VDC can be matched simultaneously to desired levels. For example, a process normally carried out using an inductively coupled plasma source can be replicated by a process carried out with VHF and HF power applied to the cathode simultaneously, provided the correct VHF and HF power levels are employed.

Figure 1:
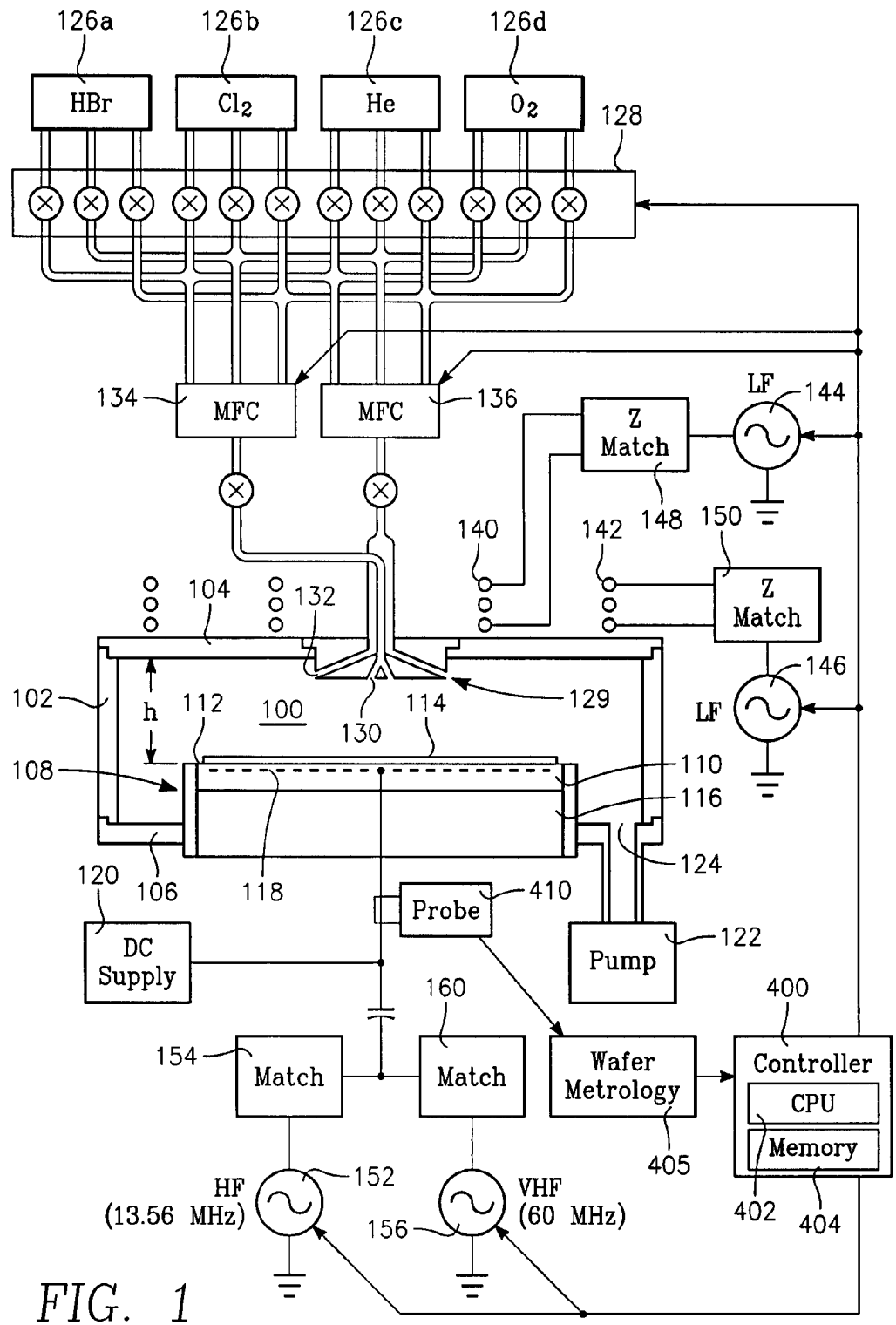
FIG. 1 illustrates a plasma reactor having a conductive gas distribution plate or showerhead and adapted to carry out a process in accordance with an embodiment.

Dual Frequency Bias Inductively Coupled Plasma Reactor:

FIG. 1 depicts a first plasma reactor adapted to carry out a process of one embodiment. A vacuum chamber 100 is enclosed by a cylindrical side wall 102, a disk-shaped ceiling 104 and a floor 106. A wafer support pedestal 108 has an insulating layer 110 inside the chamber 100, the insulating layer 110 providing a wafer support surface 112 for supporting a semiconductor wafer 114. The insulating layer 110 is formed on a metal base 116, the entire pedestal 108 being axially movable to adjust the height h of a gap between the ceiling 104 and the wafer support surface 112. A cathode electrode 118 is provided within the insulating layer 110, and a separated from the wafer 114 by a thin portion of the insulating layer 110. A D.C. voltage supply 120 may be coupled to the cathode electrode 118 for purposes of electrostatically clamping the wafer 114 to the wafer support surface 112. The vacuum chamber 100 is evacuated by a pump 122 through an opening 124 in the chamber floor 106. A process gas is formed as a mixture of gases from different gas supplies 126a, 126b, 126c, 126d flowing through a gas panel 128. A gas distribution plate 129 has inner and outer spray nozzles 130, 132, respectively, supported within the chamber 100 at the center of the ceiling 104. Gas flow from the gas panel 128 to the inner and outer nozzles 130, 132 is controlled separately by respective valves or mass flow controllers 134, 136. An inductive RF plasma source power applicator disposed over the ceiling 104 consists of an inner coil antenna 140 and an outer coil antenna 142. In one embodiment, both coil antennas 140, 142 may be formed of respective elongate conductors wound as helical solenoids, in the manner depicted in the drawing. RF power sources 144, 146 are coupled to the coil antennas 140, 142, through respective RF impedance match elements 148, 150. In one embodiment, the RF power sources 144, 146 may be separate RF generators of slightly different (offset) low RF frequencies (on the order of a few MHz). In another embodiment, the power sources 144, 146 are separate outputs of a single RF power generator (of a single frequency) whose output power is divided between the impedance match elements 148, 150. Plasma bias power is supplied by an RF power generator 152 having a frequency in the LF or HF band. The bias power generator 152 is coupled through an RF impedance match element 154 to the cathode electrode 118. An optional isolation capacitor may be interposed between the outputs of the RF match element 154 and the D.C. voltage supply 120. As an additional power source for plasma ion generation, a VHF power generator 156 is coupled to the cathode electrode 118 through an RF impedance match element 160. The gas distribution plate 129, which may be formed of metal, has a diameter less than that of the inner coil antenna 140, so that the gas distribution plate 129 does not block inductive coupling from the antenna 140 into the chamber.

The reactor of FIG. 1 may further include a controller 400 governing the different active components of the reactor including the D.C. (chucking) voltage supply 120, the vacuum pump 122, the gas panel 128, the RF power sources 144, 146, the bias power generator 152 and the VHF power generator 156. The controller 400 may include a computer or central processing unit 402 and a memory or computer readable media 404. Wafer metrology 405 apparatus may measure parameters (e.g., critical dimension and/or etch depth) on succession of test wafers before and/or after they are processed in the reactor, and provide its output or measurements to the computer 402. In addition, plasma conditions during processing may be sensed by a probe 410 of a conventional type (e.g., such as a Langmuir probe in the chamber 100 or a voltage or current probe coupled to the wafer, or both). The probe 410 provides its output to the computer 402. For this purpose, the controller 400 may also govern conventional wafer-handling robotics (not shown) capable of rapidly loading a test wafer into the reactor for etch processing and loading the same wafer into the wafer metrology apparatus 405 either before or after processing of the test wafer in the reactor. In this manner, a large succession of test wafers may be processed under different processing conditions, and the measurement data from the metrology apparatus 405 correlated with the different process conditions by the computer 402 and stored in the memory 404.

Figure 2:
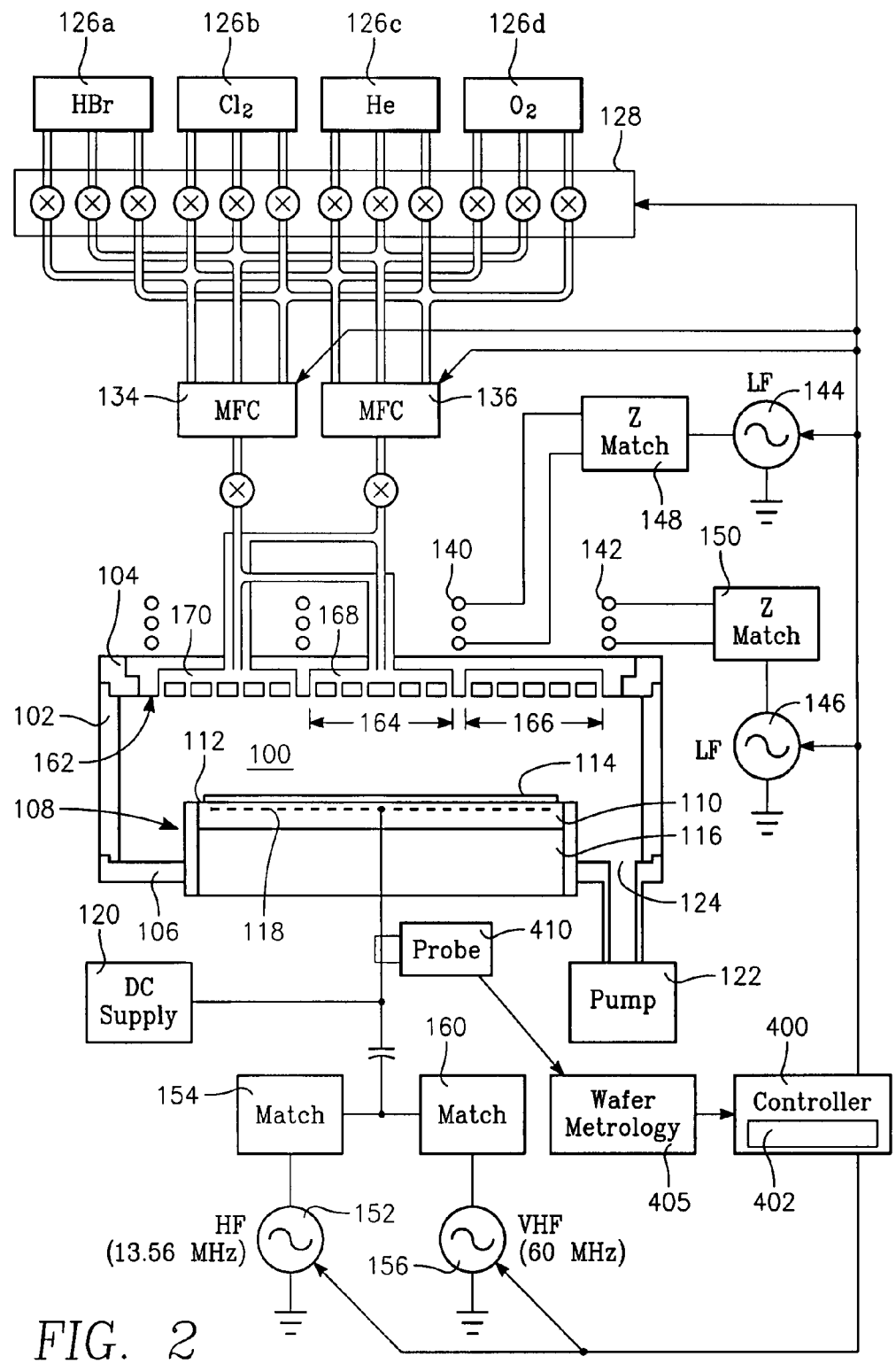
FIG. 2 illustrates a plasma reactor corresponding to that of FIG. 1 but having a non-conductive or ceramic showerhead.

FIG. 2 depicts a second plasma reactor adapted to carry out a process of one embodiment. The reactor of FIG. 2 is nearly identical to the reactor of FIG. 1 except that the small gas distribution plate 129 of FIG. 1 is replaced by a large gas distribution plate 162 formed of a non-conductive material such as ceramic. The large gas distribution plate 162 of FIG. 2 has a diameter nearly the same as the ceiling diameter. The gas distribution plate 162 of FIG. 2 has inner and outer gas distribution zones 164, 166, each consisting of an array of gas injection orifices in the plate. The inner and outer zones 164, 166 receive process gas at respective inner and outer gas manifolds 168, 170.

Process with Combined HF and VHF on Cathode:

A baseline inductively coupled (ICP) plasma process may be employed for etching a polysilicon layer to form polysilicon FET gates of a desired gate length or critical dimension (CD) at a desired etch rate. For example, for a CD of 78 nm at the bottom of the gate and an etch rate of 670 Å/min, an ICP process may be employed in which the chamber pressure is maintained at 4 mT, while the following process gases enter through the gas distribution plate: HBr at 180 sccm, $Cl_2$ at 40 sccm, He at 22 sccm and $O_2$ at 10 sccm. In this ICP process, 400 Watts of RF plasma source power at 13.56 MHz is approximately evenly distributed between the inner and outer coils 140, 142, while 90 Watts of RF plasma bias power at 13.56 MHz is applied to the cathode electrode 118. The foregoing ICP process is given as an example only for purposes of illustration. It is understood that other CD values or gate lengths may be realized using other ICP processes. For example, gate lengths are currently in the range of about 45-65 nm, while some new applications may require smaller gate lengths. Furthermore, while the two parameters of concern in the foregoing example were CD and etch rate, the two parameters of concern may instead be ion energy (or equivalently VDC) and plasma ion density.

Figure 3:
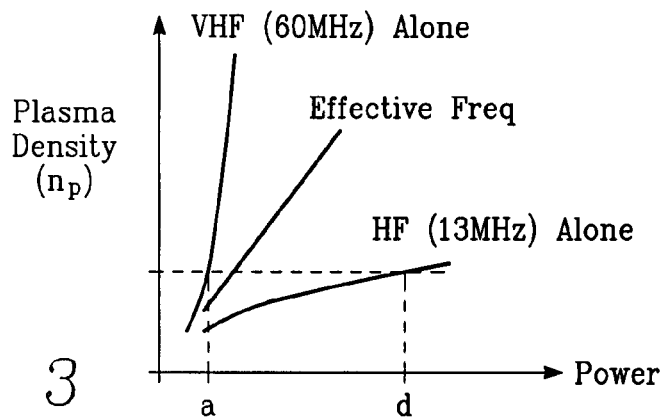
FIG. 3 is a graph of two curves depicting, respectively, plasma ion density as a function of VHF power on the cathode, and plasma ion density as a function of HF power on the cathode.
Figure 4:
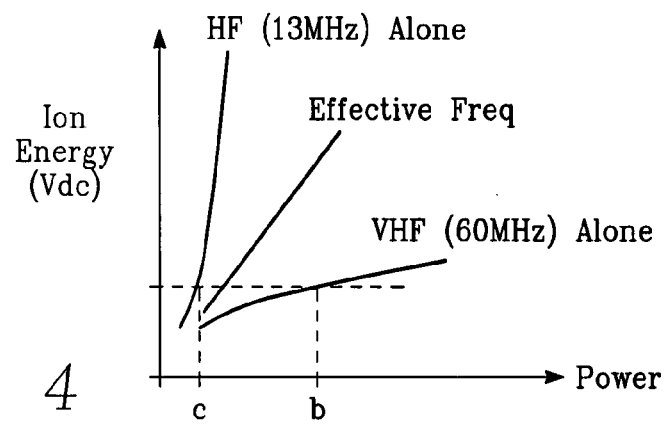
FIG. 4 is a graph of two curves depicting, respectively, plasma ion energy as a function of VHF power on the cathode, and plasma ion energy as a function of HF power on the cathode.
Figure 5:
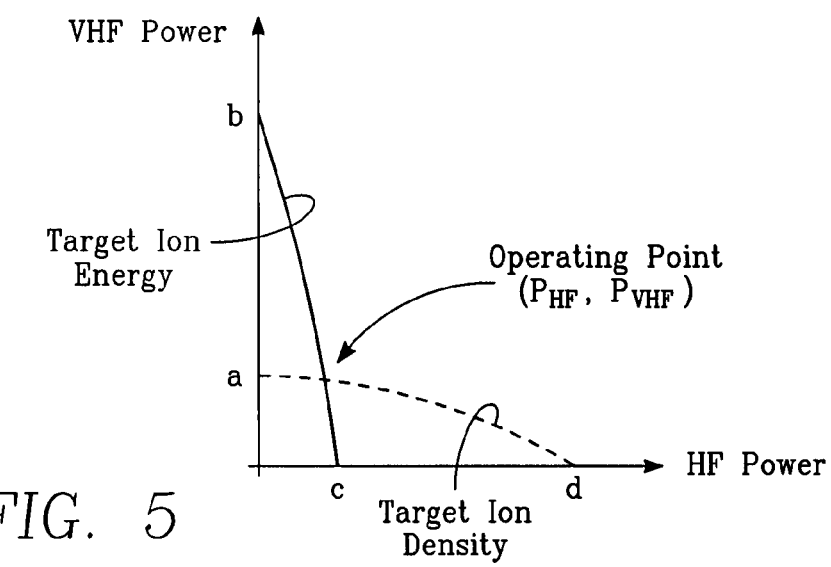
FIG. 5 is a graph of two curves depicting, respectively, a set of VHF and HF power level pairs at which a target ion density is maintained, and a set of VHF and HF power level pairs at which a target ion energy is maintained.

We have discovered that the desired values of a pair of performance parameters (e.g., CD and etch rate, or, VDC and ion density) realized in such an ICP process may be realized in a process in which, the RF plasma source power applied to the coil antennas 140, 142 is replaced by VHF power applied to the cathode simultaneously with the HF bias power applied to the cathode electrode 118. Our discovery involves determining the simultaneous power levels of the HF and VHF power applied to the cathode electrode that simultaneously produce the desired values of the pair of performance parameters. One example of the determination of the simultaneous HF and VHF power levels on the cathode electrode 118 is depicted in FIGS. 3, 4 and 5. In this example, the pair of process parameters of interest is plasma ion density and plasma ion energy (VDC).

FIG. 3 is a graph depicting plasma ion density as a function of RF power applied to the cathode electrode 118. The curve labeled "VHF" depicts the behavior of ion density when only VHF power (at 60 MHz) is applied. The curve labeled "HF" depicts the behavior of ion density when only HF power (at 13.56 MHz) is applied. The horizontal dashed line corresponds to the desired value of ion density. The VHF curve intersects the desired ion density value at a power level designated "a", while the HF curve intersects the desired ion density value at a power level designated "d" in FIG. 3.

In one embodiment, data corresponding to the graph of FIG. 3 may be generated by the controller 400 setting the VHF and HF power levels and governing the reactor of FIG. 1 to perform successive etch processes on successive test wafers at the various combinations of VHF and HF power levels or points on the graph of FIG. 3. The parameter of interest (e.g., ion density in FIG. 3 or ion energy in the case of FIG. 4 discussed below) is measured for each one of the successively processed test wafers using the wafer metrology apparatus 405 (which can measure etch depth or etch rate to determine ion density or critical dimension or gate length) or the probe 410 (which can measure bias voltage or ion density). The computer 402 included within the controller 400 may be programmed to correlate all such measurements with the corresponding applied VHF and HF power levels, to generate the data points corresponding to the graph of FIG. 3. Automatic rapid generation of such data using a succession of test wafers in successive etch processes carried out in the reactor under different conditions (e.g., different HF or VHF power levels) may be implemented by the computer 402 executing a sequence of instructions stored in the memory 404. It is understood that the processes concerning the data corresponding to each of the graphs of FIGS. 4 through 12 described below are implemented by different sequences of instructions stored in the memory 404 which the skilled worker can readily implement in view of the disclosure of this specification.

FIG. 4 is a graph depicting plasma ion energy at the wafer surface as a function of RF power applied to the cathode electrode 118. The curve labeled "VHF" depicts the behavior of ion energy when only VHF power (at 60 MHz) is applied. The curve labeled "HF" depicts the behavior of ion energy when only HF power (at 13.56 MHz) is applied. The horizontal dashed line corresponds to the desired value of ion energy. The HF curve intersects the desired ion energy value at a power level designated "c", while the VHF curve intersects the desired ion energy value at a power level designated "b" in FIG. 4.

FIG. 5 is a graph synthesizing the results of FIGS. 3 and 4, in which simultaneous VHF and HF power levels are plotted on the vertical and horizontal axes, respectively. The curve in FIG. 5 labeled "target ion density" corresponds to FIG. 3 and shows that the desired ion density level is attained at a point (0,a)—when VHF power is at the power level "a" and HF power is zero—and at a point (d,0)—when VHF power is zero and HF power is at a power level "d", and at points in between lying along the target in density curve. The target ion density curve may be obtained by interpolation from a small number of test data points. The curve in FIG. 5 labeled "target ion energy" corresponds to FIG. 4 and shows that the desired ion energy level is attained at a point (0,b)—when VHF power is at the power level "b" and HF power is zero—and at a point (c,0)—when VHF power is zero and HF power is at a power level "c", and at points in between lying along the target ion energy curve. The target ion energy curve may be obtained by interpolation from a small number of test data points. The intersection of the curves "target ion density" and "target ion energy" is a point defining a pair of HF and VHF power levels, ($P_{HF}$, $P_{VHF}$), at which the target ion energy and density values are attained simultaneously. This intersection may be found by the computer 402 of the controller 400 using conventional graphing and search techniques.

Figure 6:
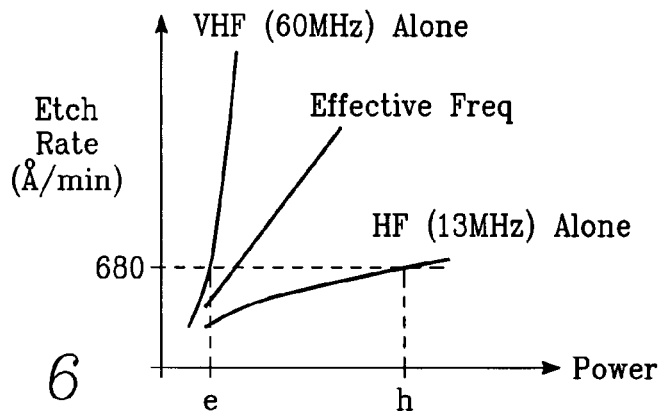
FIG. 6 is a graph of two curves depicting, respectively, etch rate as a function of VHF power on the cathode, and etch rate as a function of HF power on the cathode.
Figure 7:
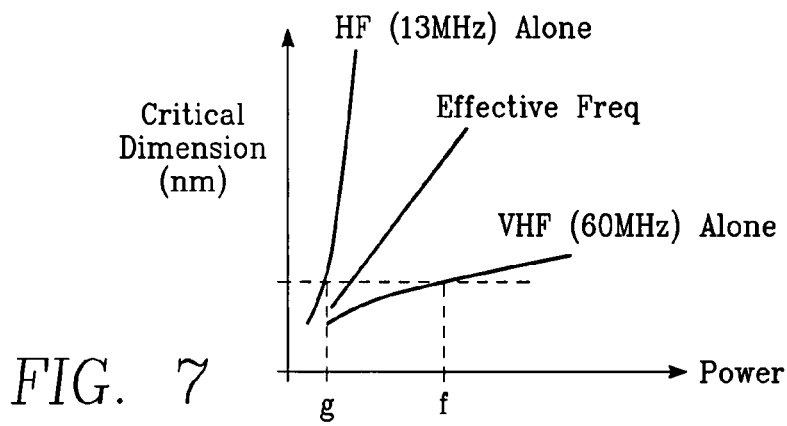
FIG. 7 is a graph of two curves depicting, respectively, critical dimension (CD) as a function of VHF power on the cathode, and CD as a function of HF power on the cathode.
Figure 8:
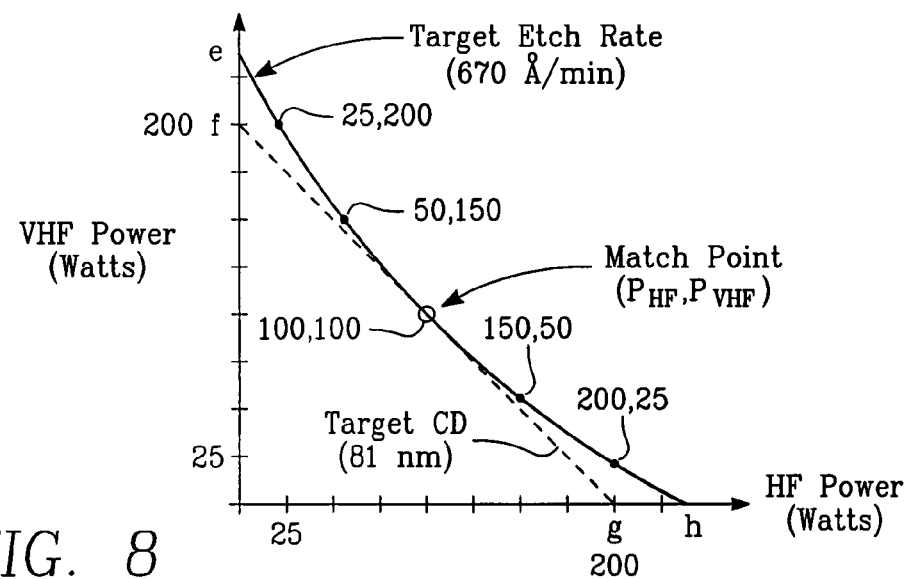
FIG. 8 is a graph of two curves depicting, respectively, a set of VHF and HF power level pairs at which a target etch rate is maintained, and a set of VHF and HF power level pairs at which a target CD is maintained.

Another example of the determination of the simultaneous HF and VHF power levels on the cathode electrode 118 is depicted in FIGS. 6, 7 and 8. In this example, the pair of process parameters of interest is etch rate and critical dimension (CD) at the gate bottom.

FIG. 6 is a graph depicting etch rate as a function of RF power applied to the cathode electrode 118. The curve labeled "VHF" depicts the behavior of etch rate when only VHF power (at 60 MHz) is applied. The curve labeled "HF" depicts the behavior of etch rate when only HF power (at 13.56 MHz) is applied. The horizontal dashed line corresponds to the desired value of etch rate, in this example about 680 Å/min. The VHF curve intersects the desired etch rate value at a power level designated "e", while the HF curve intersects the desired etch rate value at a power level designated "h" in FIG. 6.

FIG. 7 is a graph depicting critical dimension (CD) at the gate bottom as a function of RF power applied to the cathode electrode 118. The curve labeled "VHF" depicts the behavior of CD when only VHF power (at 60 MHz) is applied. The curve labeled "HF" depicts the behavior of CD when only HF power (at 13.56 MHz) is applied. The horizontal dashed line corresponds to the desired value of CD. The HF curve intersects the desired CD value at a power level designated "g", while the VHF curve intersects the desired ion energy value at a power level designated "f" in FIG. 7.

FIG. 8 is a graph synthesizing the results of FIGS. 6 and 7, in which simultaneous VHF and HF power levels are plotted on the vertical and horizontal axes, respectively. The curve in FIG. 8 labeled "target etch rate" corresponds to FIG. 6 and shows that the desired etch rate level is attained at a point (0,e)—when VHF power is at the power level "a" and HF power is zero—and at a point (h,0)—when VHF power is zero and HF power is at a power level "h", and at points in between lying along the curve. The curve in FIG. 8 labeled "target CD" corresponds to FIG. 7 and shows that the desired CD value is attained at a point (0,f)—when VHF power is at the power level "f" and HF power is zero—and at a point (g,0)—when VHF power is zero and HF power is at a power level "g", and at points in between lying along the curve. The intersection of the curves "target etch rate" and "target CD" is a point defining a pair of HF and VHF power levels, ($P_{HF}$, $P_{VHF}$), at which the target etch rate and CD values are attained simultaneously.

Figure 9:
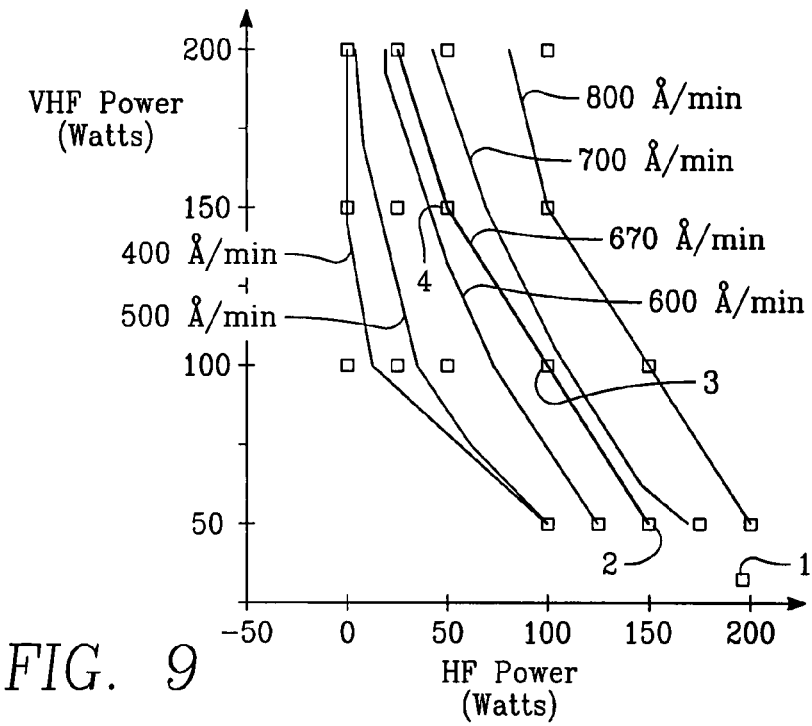
FIG. 9 is a graph of several respective curves depicting, for respective etch rates, a set of VHF and HF power level pairs at which the respective etch rate is maintained.

The optimum "match" point ($P_{HF}$, $P_{VHF}$) can be found, in one embodiment, by the computer 402 determining at least an approximation of the "target etch rate" and "target CD" curves of FIG. 8 by interpolation using a few test data points. In another embodiment, only one of the two curves is found by interpolation. For example, the "target etch rate" curve of FIG. 8 is found or approximated by the computer 402 using several test data points. Then, the CD is tested by etching successive test wafers under different conditions defined at the various points along the "target etch rate" curve. The point on the "target etch rate" curve providing a CD value that is closest to the target or desired CD is chosen as the optimum match point ($P_{HF}$, $P_{VHF}$). One example of this latter procedure is illustrated in the graph of FIG. 9. The graph of FIG. 9 represents test data produced by measuring the etch rate attained by etch processes carried out at the baseline reactor conditions, discussed above, but with HF power and VHF power set to different combinations of values. These values are denoted by the data points in FIG. 9. The values are sorted according to etch rate. It was found that points of common etch rates lie on different points of the same curve, different etch rates corresponding to different curves. These different curves are labeled in accordance with their etch rate in FIG. 9, as "400 Å/min", "500 Å/min", "600 Å/min", "670 Å/min", "700 Å/min" and "800 Å/min". The different curves were obtained by conventional interpolation of the respective test data points. Since the desired etch rate is about 670 Å/min, the curve labeled "670 Å/min" was chosen, and discrete points along this curve were tested to measure the corresponding CD value in order to find the optimum match point. The "670 Å/min" curve of FIG. 9 is the same as the "target etch rate" curve of FIG. 8. The results were as follows:

- at point number 1 of FIG. 9, HF power was 200 W, VHF power was 25 W, etch rate was 670 Å/min, and bottom CD was 85 nm (which is too great);
- at point number 2 of FIG. 9, HF power was 150 W, VHF power was 50 W, etch rate was 670 Å/min, and bottom CD was slightly over 81 nm;
- at point number 3 of FIG. 9, HF power was 100 W, VHF power was 100 W, etch rate was 670 Å/min, and bottom CD was 81 nm (which was the closest to the desired CD value);
- at point number 4 of FIG. 9, HF power was 50 W, VHF power was 150 W, etch rate was 670 Å/min, and bottom CD was 82 nm (which is too great).

Based upon these results, point number 3 was chosen as the optimum match point ($P_{HF}$, $P_{VHF}$)=(100 W, 100 W).

The foregoing search and optimization procedure can be speedily performed with as many test data points as desired using the programmed computer 402 and conventional algorithms which may be stored as instructions in a memory (computer-readable media) 404 of the computer 402.

Process with Combined HF & VHF on Cathode and RF on Coil:

In the foregoing process examples, the combination of HF and VHF power applied to the cathode electrode replaced the RF power applied to the coil antennas 140, 142, with zero RF power being applied to the coil antennas 140, 142. In the following embodiments, the HF and VHF power applied in combination to the cathode electrode 118 only partially replaces the RF power applied to the coil antennas 140, 142, so that some RF power is applied to the coil antennas 140, 142 although at a reduced power level to accommodate the combined HF, VHF power applied to the cathode electrode 118. An advantage of such a process is that a high plasma ion density is efficiently attained using inductively coupled source power from the coil antennas 140, 142, while a more uniform distribution of plasma ion density is attained by applying VHF power to the cathode electrode 118. What is required is a determination of an optimum operating point ($P_{HF}$, $P_{VHF}$, $P_{COIL}$), namely optimum values of HF power on the cathode, VHF power on the cathode and RF power on the coil antennas at which the desired plasma ion density and energy values are obtained simultaneously. A method for determining the optimum operating point ($P_{HF}$, $P_{VHF}$, $P_{COIL}$) is now discussed with reference to FIGS. 10A, 10B, 11A, 11B and 12.

Figure 10A:
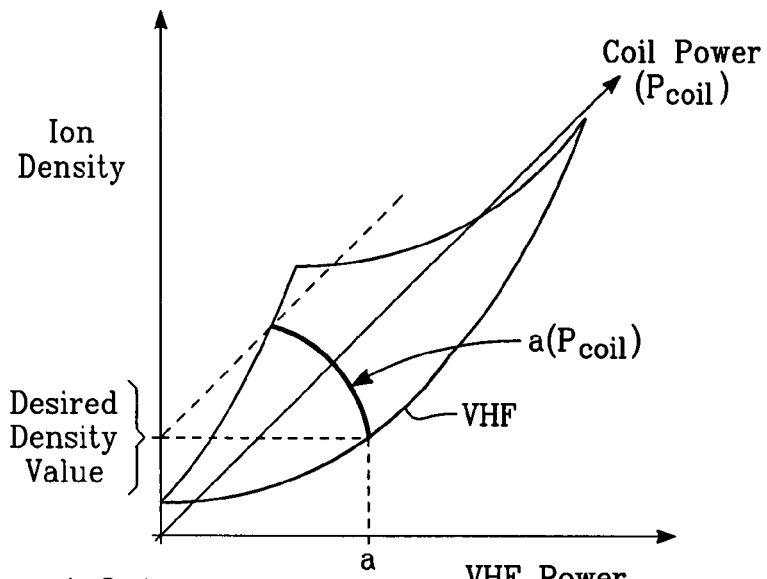
FIG. 10A is a graph depicting plasma ion density as a function of VHF power on the cathode and RF power on the coil antenna.

FIG. 10A is a graph having three orthogonal axes labeled "VHF power", "coil power" and "ion density". The curve labeled "VHF" is the same as the curve labeled "VHF" in FIG. 3, and depicts the behavior of ion density with VHF power alone applied to the cathode electrode (so that coil power=0). As coil power is increased, the ion density response is shifted up, generating the upward-sloping surface depicted in FIG. 10A. The optimum VHF power level, "a", at which the desired etch rate is attained in the absence of any other RF power source, is illustrated in both FIGS. 3 and 10A. As depicted in FIG. 10A, this optimum value starts at "a" but decreases as coil power increases, curving along the upward-sloping surface of FIG. 10A with increasing coil power to maintain a constant ion density value. The resulting trajectory of the optimum VHF power is a curve in the three-dimensional space of FIG. 10A, and is labeled "a($P_{COIL}$)" in FIG. 10A.

Figure 10B:
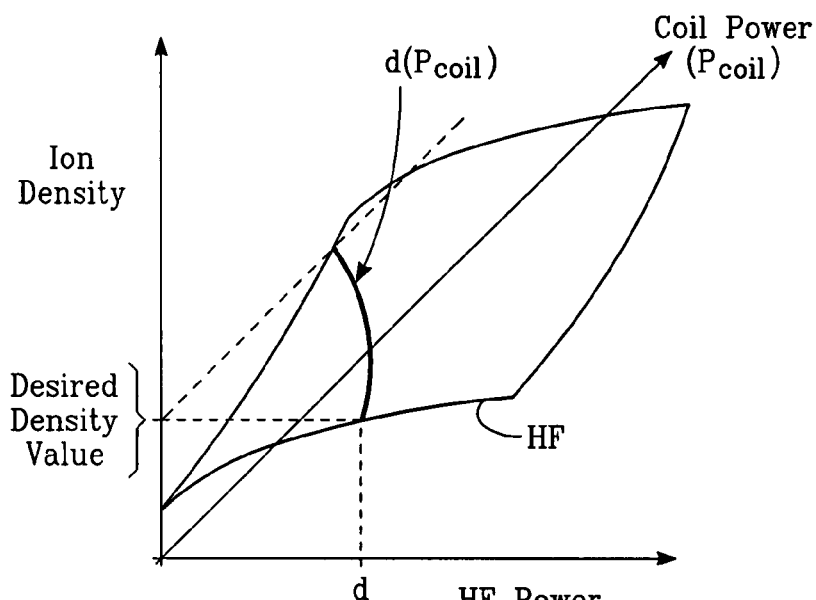
FIG. 10B is a graph depicting plasma ion density as a function of HF power on the cathode and RF power on the coil antenna.

FIG. 10B is a graph having three orthogonal axes labeled "HF power", "coil power" and "ion density". The curve labeled "HF" is the same as the curve labeled "HF" in FIG. 3, and depicts the behavior of ion density with HF power alone applied to the cathode electrode (so that coil power=0). As coil power is increased, the ion density response is shifted up, generating the upward-sloping surface depicted in FIG. 10B. The optimum HF power level, "d", at which the desired etch rate is attained in the absence of any other RF power source, is illustrated in both FIGS. 3 and 10A. As depicted in FIG. 10B, this optimum value starts at "d" but decreases as coil power increases, curving along the upward-sloping surface of FIG. 10B with increasing coil power to maintain a constant ion density value. The resulting trajectory of the optimum HF power is a curve in the three-dimensional space of FIG. 10B, and is labeled "d($P_{COIL}$)" in FIG. 10B.

With respect to the graph of FIG. 10B, maintaining a given plasma ion density value requires much less RF power on the coil than HF bias power, so that the HF bias power levels in the graph of FIG. 10B greatly exceed the levels of RF power applied to the coil, so that the scales of the two corresponding axes in FIG. 10B may differ significantly.

Figure 11A:
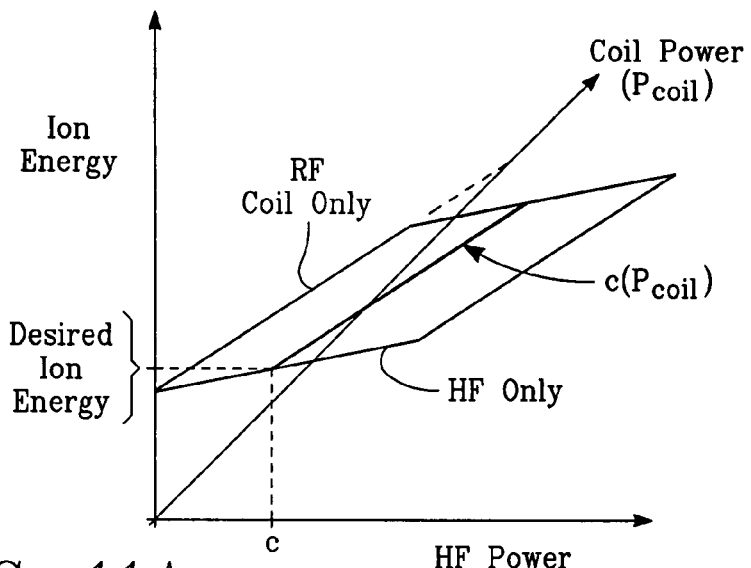
FIG. 11A is a graph depicting plasma ion energy as a function of HF power on the cathode and RF power on the coil antenna.

FIG. 11A is a graph having three orthogonal axes labeled "HF power", "coil power" and "ion energy". The curve labeled "HF" is the same as the curve labeled "HF only" in FIG. 4, and depicts the behavior of ion energy with HF power alone applied to the cathode electrode (so that coil power=0). As coil power is increased, the ion energy is depressed, generating the surface depicted in FIG. 11A bounded by the downward-sloping curve labeled "RF coil only" in FIG. 11A. The optimum HF power level, "c", at which the desired ion energy is attained in the absence of any other RF power source, is illustrated in both FIGS. 4 and 11A. As depicted in FIG. 11A, this optimum value starts at "c" but increases as coil power increases, curving or climbing up along the downward-sloping surface of FIG. 11A with increasing coil power to maintain ion energy at the desired value. The resulting trajectory of the optimum HF power is a curve in the three-dimensional space of FIG. 11A, and is labeled "c($P_{COIL}$)" in FIG. 11A. Since the ion energy decreases as RF coil power increases, the desired ion energy level cannot be maintained at higher values of RF coil power.

Figure 11B:
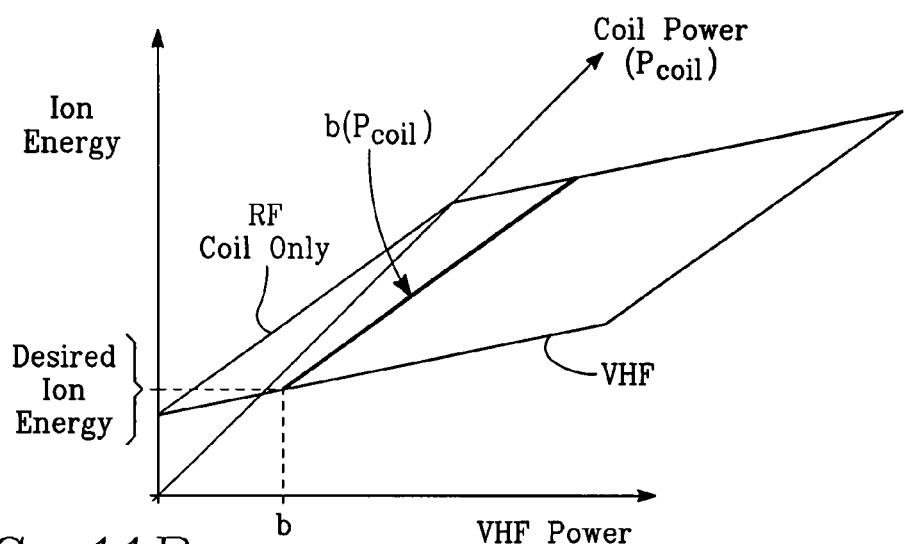
FIG. 11B is a graph depicting plasma ion energy as a function of VHF power on the cathode and RF power on the coil antenna.

FIG. 11B is a graph having three orthogonal axes labeled "VHF power", "coil power" and "ion energy". The curve labeled "VHF" is the same as the curve labeled "VHF" in FIG. 4, and depicts the behavior of ion energy with VHF power alone applied to the cathode electrode (so that coil power=0). As coil power is increased, the ion energy is depressed, generating the surface depicted in FIG. 11B bounded by the downward sloping curve labeled "RF coil only" in FIG. 11B. The optimum VHF power level, "b", at which the desired ion energy is attained in the absence of any other RF power source, is illustrated in both FIGS. 4 and 11B. As depicted in FIG. 11B, this optimum value starts at "b" but increases as coil power increases, curving or climbing up along the downward-sloping surface of FIG. 11B with increasing coil power to maintain ion energy at the desired value. The resulting trajectory of the optimum VHF power is a curve in the three-dimensional space of FIG. 11B, and is labeled "b($P_{COIL}$)" in FIG. 11A.

Figure 12:
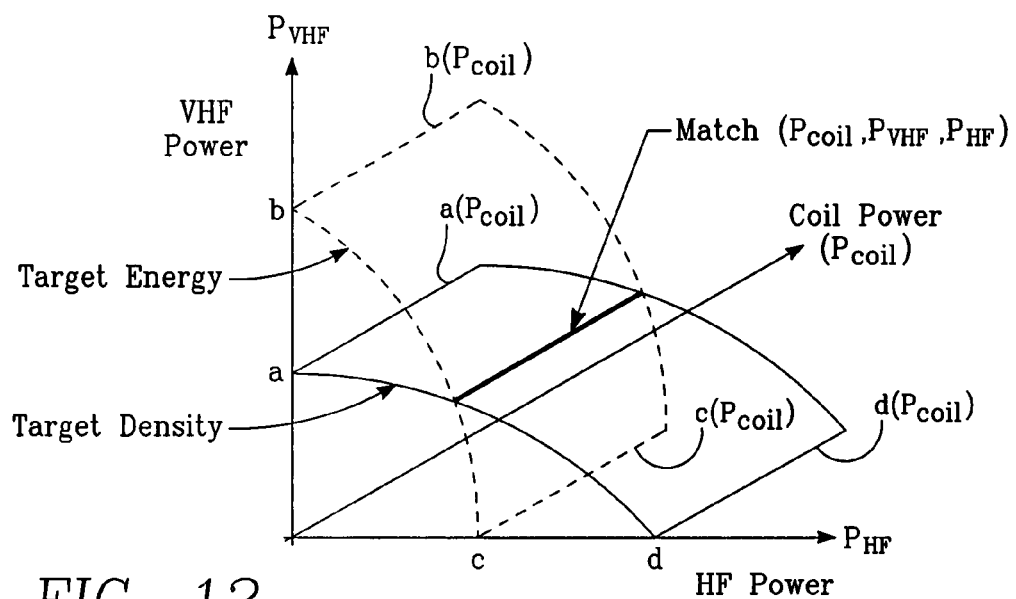
FIG. 12 is a graph of a three-dimensional space having axes of HF cathode power, VHF cathode power and RF coil power, and illustrating two surfaces in that space, including a target density surface, derived from the graphs of FIGS. 10A and 10B, at which a target ion density is maintained, and a target energy surface, derived from the graphs of FIGS. 11A and 11B, at which a target ion energy is maintained.

FIG. 12 is a graph corresponding to the two-dimensional graph of FIG. 5, but having a third dimension or axis, namely "coil power", so that FIG. 12 has three orthogonal axes labeled "VHF power", "HF power" and "coil power". Along the vertical plane intersecting the two axes "HF power" and "VHF power" (corresponding to coil power=0) in FIG. 12, the two curves labeled "target density" and "target energy" are the same as the two curves with the same labels depicted in FIG. 5. As coil power increases from zero, the optimum HF and VHF power levels necessarily decrease to maintain the desired energy and density values. This effect corresponds to respective surfaces extending from the "target energy" and "target density" curves depicted in FIG. 12. The surface extending from the "target density" curve of FIG. 12 coincides with (or is bounded by) the two curves a($P_{COIL}$) and d($P_{COIL}$) discussed above with reference to FIGS. 10A and 10B. This surface of FIG. 12 is the "target density" surface. The surface extending from the "target energy" curve of FIG. 12 lies coincides with (or is bounded by) the two curves b($P_{COIL}$) and c($P_{COIL}$) discussed above with reference to FIGS. 11A and 11B. This latter surface of FIG. 12 is the "target energy" surface.

The two surfaces of FIG. 12 intersect one another along a line (or curve) labeled "match" in FIG. 12. The "match" line in FIG. 12 defines a set of points ($P_{HF}$, $P_{VHF}$, $P_{COIL}$) in the three-dimensional space of FIG. 12 at which the desired ion density value and the desired ion energy value are attained simultaneously. The user may select any combination of values of HF, VHF and coil RF power levels, i.e., any point ($P_{HF}$, $P_{VHF}$, $P_{COIL}$), that lies along the "match" line of FIG. 12. Using conventional interpolation and graphing techniques, the computer 402 may be employed to produce an approximation of the surfaces of FIGS. 10A, 10B, 11A, 11B. From the surfaces of FIGS. 10A and 10B, the computer 402 may find the constant density curves a($P_{COIL}$), d($P_{COIL}$) from which the computer can interpolate the target density surface of FIG. 12. From the surfaces of FIGS. 11A and 11B, the computer 402 may find the constant energy curves C($P_{COIL}$), d ($P_{COIL}$) from which the computer 402 may interpolate the target energy surface of FIG. 12. The computer 402 may further find the intersection of the two surfaces of FIG. 12 (the target density surface and the target energy surface) in order to determine the set of points ($P_{HF}$, $P_{VHF}$, $P_{COIL}$) lying along that intersection or "match" line. This determination may be made by the computer 402 using conventional graphing and search techniques.

The identification of points along the "match" or intersection line of FIG. 12 enables the user to choose different levels for the total RF power applied to the inner and outer coils 140, 142. In this way, the user can choose the degree to which the VHF and HF power applied to the cathode electrode 118 suppresses the tendency of RF power applied to the coil antennas 140, 142 to concentrate ion density beneath the discrete coil antenna patterns.

Figure 13:
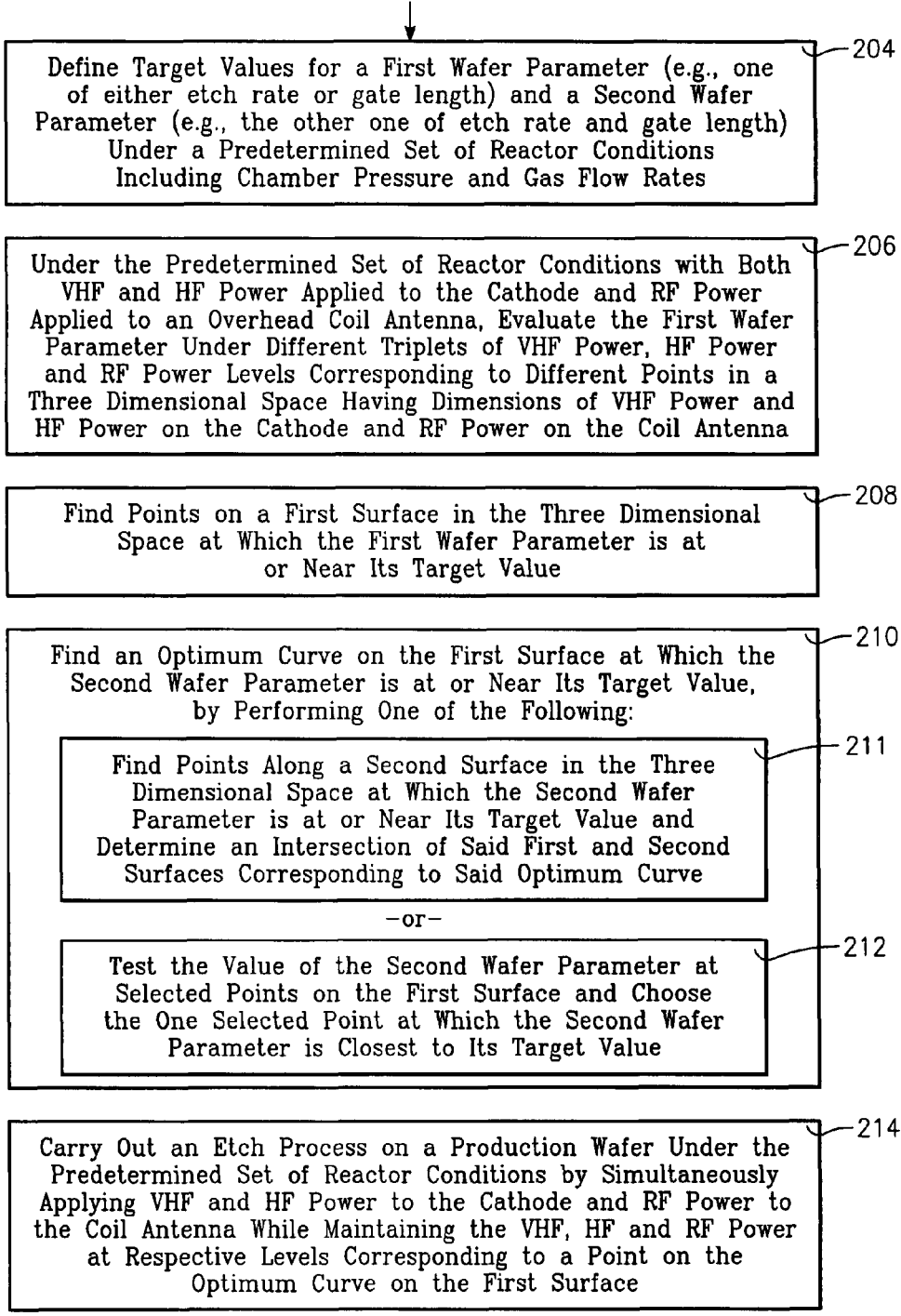
FIG. 13 is a block diagram illustrating a plasma etch process in accordance with a first embodiment involving the graphs of FIGS. 3-5.

Exemplary Process Sequences:

FIG. 13 is a flow chart depicting an exemplary process sequence corresponding to FIGS. 3-5. This process sequence may be implemented by the computer 402 by executing a corresponding sequence of instructions stored in the memory 404. First, target values are defined (block 204) for a first plasma parameter (e.g., one of either ion density or ion energy) and a for second plasma parameter (e.g., the other one of ion density and ion energy) under a predetermined set of reactor conditions including chamber pressure and gas flow rates. In this example, the pair of parameters of interest includes the plasma parameters of ion density and ion energy, in another embodiment the pair of parameters of interest may be the wafer parameters of etch rate and critical dimension. In one example, the predetermined set of reactor conditions may be the baseline conditions discussed above, in which the chamber pressure is maintained at 4 mT, while the following process gases enter through the gas distribution plate: HBr at 180 sccm, $Cl_2$ at 40 sccm, He at 22 sccm and $O_2$ at 10 sccm. Next, in block 206, both VHF and HF power applied to the cathode (with coil power=0), while evaluating the first plasma parameter under different pairs of VHF and HF power levels corresponding to different points in a two dimensional space having dimensions of VHF power and HF power. Conventional methods (e.g., interpolation) are employed to find points along a first curve in the two dimensional space at which the first plasma parameter is at or near its target value (block 208). In one embodiment, this corresponds to generating the VHF and HF curves of FIG. 3. Conventional search techniques are used to find an optimum point along the first curve at which the second plasma parameter is at or near its target value (block 210). This may be accomplished by finding points along a second curve in the two dimensional space at which the second plasma parameter is at or near its target value, and find the intersection of the first and second curves (block 211). Block 211 corresponds to generating the VHF and HF curves of FIG. 4 and then synthesizing the graphs of FIGS. 3 and 4 to produce the intersecting curves of FIG. 5, and locating the point of intersection. Alternatively, the operation of block 210 may be performed by testing the value of the second plasma parameter at selected points along the first curve and choosing the one selected point at which the second plasma parameter is closest to its target value (block 212). Finally, the user may then carry out an etch process on a production wafer under the predetermined set of reactor conditions by simultaneously applying VHF and HF power to the cathode while maintaining the VHF and HF power at levels corresponding to the optimum point along the first curve (block 214).

Figure 14A:
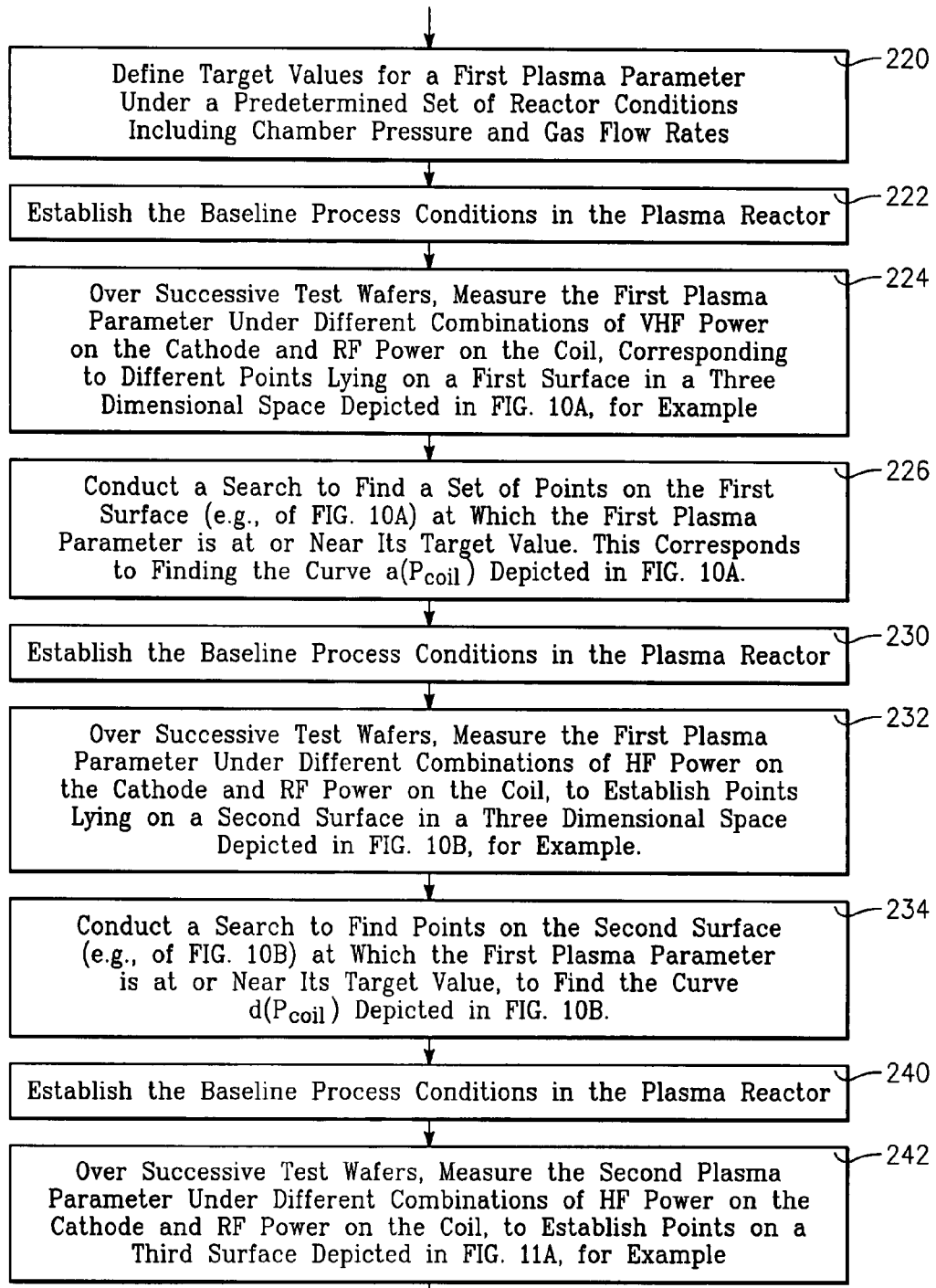
FIGS. 14A and 14B, hereinafter referred to collectively as FIG. 14, constitute a block diagram illustrating a plasma etch process in accordance with a second embodiment involving the graphs of FIGS. 10A, 10B, 11A, 11B and 12.
Figure 14B:
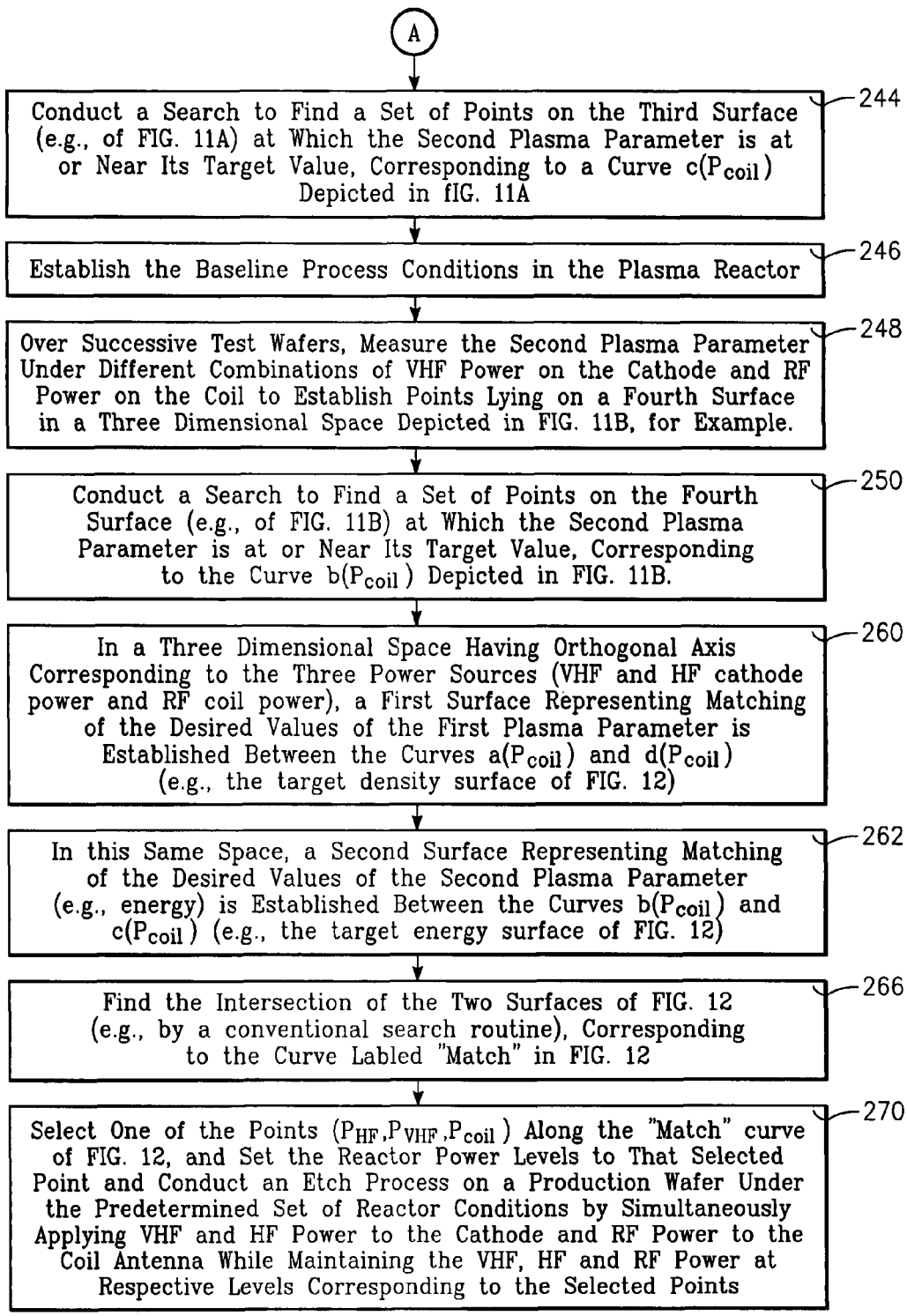

FIGS. 14A and 14B constitute a flow chart depicting a process sequence corresponding to FIGS. 10A-12 in which RF power is applied to the coil antennas along with the VHF and HF power applied to the cathode electrode. FIGS. 14A and 14B are referred collectively as FIG. 14 hereafter. This process sequence may be implemented by the computer 402 by executing a corresponding sequence of instructions stored in the memory 404. A first step (block 220 of FIG. 14) is to define target values for a first plasma parameter (e.g., one of either ion density or ion energy) and a second plasma parameter (e.g., the other one of ion density and ion energy) under a predetermined set of reactor conditions including chamber pressure and gas flow rates. In this example, the pair of parameters of interest are the plasma parameters of ion density and ion energy, in another embodiment the pair of parameters of interest may be the wafer parameters of etch rate and critical dimension. In one example, the predetermined set of reactor conditions may be the baseline conditions discussed above, in which the chamber pressure is maintained at 4 mT, while the following process gases enter through the gas distribution plate: HBr at 180 sccm, $Cl_2$ at 40 sccm, He at 22 sccm and $O_2$ at 10 sccm.

In block 222, the baseline reactor process conditions are established. Then, over successive test wafers, the first plasma parameter is measured under different combinations of VHF power on the cathode and RF power on the coil (block 224). Each combination corresponds to different points in a three dimensional space having orthogonal axes of VHF power (cathode), RF power (coil antenna) and the first plasma parameter (e.g., ion density). This establishes points lying on a first surface in a three dimensional space depicted in FIG. 10A, for example. A search is then conducted to find points on the first surface (e.g., of FIG. 10A) at which the first plasma parameter is at or near its target value (block 226). This corresponds to finding the curve a ($P_{COIL}$) depicted in FIG. 10A.

In block 230 the baseline reactor process conditions are established. Then, over successive test wafers, the first plasma parameter is measured under different combinations of HF power on the cathode and RF power on the coil (block 232). Each combination corresponds to different points in a three dimensional space having orthogonal axes of HF power (cathode), RF power (coil antenna) and the first plasma parameter (e.g., ion density). This establishes points lying on a second surface in a three dimensional space depicted in FIG. 10B, for example. A search is then conducted to find points on the second surface (e.g., of FIG. 10B) at which the first plasma parameter is at or near its target value (block 234). This corresponds to finding the curve d($P_{COIL}$) depicted in FIG. 10B.

In block 240, the baseline reactor process conditions are established. Then, over successive test wafers, the second plasma parameter is measured under different combinations of HF power on the cathode and RF power on the coil (block 242). Each combination corresponds to different points in a three dimensional space having orthogonal axes of HF power (cathode), RF power (coil antenna) and the second plasma parameter (e.g., ion energy). This establishes points lying on a third surface in a three dimensional space depicted in FIG. 11A, for example. A search is then conducted to find points on the third surface (e.g., of FIG. 11A) at which the second plasma parameter is at or near its target value (block 244). This corresponds to finding the curve C($P_{COIL}$) depicted in FIG. 11A.

In block 246, the baseline process conditions are established. Then, over successive test wafers, the second plasma parameter is measured under different combinations of VHF power on the cathode and RF power on the coil (block 248). Each combination corresponds to different points in a three dimensional space having orthogonal axes of VHF power (cathode), RF power (coil antenna) and the second plasma parameter (e.g., ion energy). This establishes points lying on a fourth surface in a three dimensional space depicted in FIG. 11B, for example. A search is then conducted to find points on the fourth surface (e.g., of FIG. 11B) at which the second plasma parameter is at or near its target value (block 250). This corresponds to finding the curve b($P_{COIL}$) depicted in FIG. 11B.

A three dimensional space having orthogonal axes corresponding to the three power sources (VHF cathode power, HF cathode power and RF coil power) is defined. In this space, a first surface representing matching of the desired values of the first plasma parameter (e.g., density) is established between the curves a($P_{COIL}$) and d($P_{COIL}$) (block 260), while a second surface representing matching of the desired values of the second plasma parameter (e.g., energy) is established between the curves b($P_{COIL}$) and C($P_{COIL}$) (block 262). This corresponds to defining the two surfaces of FIG. 12.

The intersection of the two surfaces of FIG. 12 is then found (e.g., by a conventional search routine) in block 266. This intersection is a curve (labeled "match" in FIG. 12) defining the set of all points ($P_{HF}$, $P_{VHF}$, $P_{COIL}$) at which the desired values of the first and second plasma parameters (e.g., density and energy or, alternatively, etch rate and gate length) are met simultaneously.

Finally, one of the points ($P_{HF}$, $P_{VHF}$, $P_{COIL}$) along the "match" curve of FIG. 12 is chosen (block 270). The reactor power levels are set to the selected point and an etch process on a production wafer under the predetermined set of reactor conditions by simultaneously applying VHF and HF power to the cathode and RF power to the coil antenna while maintaining the VHF, HF and RF power at respective levels corresponding to the selected point ($P_{HF}$, $P_{VHF}$, $P_{COIL}$)

The process of either FIG. 13 or FIG. 14 may be performed using the reactor of FIG. 1 or 2, with the controller 400 implementing the process. A process recipe can be stored in a set of instructions in the memory 404 of the computer 402, so that the memory 404 stores a set of instructions corresponding to the process of either FIG. 13 or FIG. 14.

While the foregoing is directed to embodiments of the invention, other and further embodiments of the invention may be devised without departing from the basic scope thereof, and the scope thereof is determined by the claims that follow.

What is claimed is:

1. A method of processing a wafer in a plasma reactor, comprising:
    placing the wafer on a wafer support surface in a chamber of the reactor;
    introducing a process gas into the chamber;
    establishing a predetermined set of process conditions including chamber pressure and flow rates of constituents of the process gas;
    simultaneously coupling HF power and VHF power to the wafer;
    setting the level of said HF power and the level of said VHF power to respective optimum levels at which a first process parameter is at a first target value and a second process parameter is at a second target value, said first and second process parameters comprising either: (a) plasma ion density in the chamber and plasma ion energy at the wafer surface, respectively, or (b) etch rate and critical dimension, respectively;
    wherein placing the wafer on the wafer support is preceded by finding said optimum levels of said HF power and VHF power, and wherein finding said optimum levels comprises:
    processing a set of test wafers under said predetermined process conditions in a plasma reactor, and, during the processing of each different one of said test wafers, simultaneously coupling VHF and HF power to the one test wafer and setting said VHF and HF power to respective levels during processing of respective ones of said test wafers;
    determining respective levels of the first process parameter during processing of respective ones of said test wafers, and correlating said respective levels of the first process parameter with corresponding levels of HF and VHF power to produce a first array of data correlating each VHF, HF power level pair to a first process parameter value;
    searching said first array of data for a constant first parameter set of VHF and HF power level pairs at which the first process parameter is at or at least nearly at the first target value, corresponding to a first curve in VHF-HF power space having a constant first parameter value; and
    finding an optimum VHF and HF power level pair in said constant density set at which the second process parameter is at or at least nearly at the second target value.

2. The method of claim 1 wherein said method mimics the results of an inductively coupled plasma process performed under said predetermined set of process conditions maintains said first and second target values of said first and second process parameters, respectively, comprising coupling only HF power to the wafer and RF coil power to a coil antenna overlying a ceiling of the reactor.

3. The method of claim 1 wherein finding the optimum VHF and HF power level pair comprises:
    determining respective levels of the second process parameter during processing of respective ones of said test wafers, and correlating said respective levels of energy with corresponding levels of HF and VHF power to produce a second array of data correlating each VHF, HF power level pair to a, second process parameter value;
    searching said second array of data for a constant second process parameter set of VHF and HF power level pairs at which the second process parameter is at or at least nearly at the second target value, corresponding to a second curve in VHF-HF power space having a constant second parameter value; and
    searching said constant first parameter and constant second parameter sets of VHF and HF power level pairs for a coincidence at which both the first and second target levels are fulfilled simultaneously, corresponding to an intersection of said first and second curves in VHF-HF power space.

4. The method of claim 3 wherein finding the optimum VHF and HF power level pair comprises:
    determining the value of the second process parameter for test wafers processed at VHF-HF power level pairs in said first array of data, and searching said first array of data for a VHF-HF power level pair at which the second process parameter is closest to the second target value.

5. The method of claim 3 wherein said first and second process parameters are plasma ion density in the chamber and plasma ion energy at the wafer surface, and determining their levels comprises performing measurements of plasma conditions during processing of the respective test wafers.

6. The method of claim 3 wherein said first and second process parameters are etch rate and critical dimension, and determining their levels comprises performing measurements on the respective test wafers after processing of each test wafer.

7. A method of processing a wafer in a plasma reactor, comprising:
    placing the wafer on a wafer support surface in a chamber of the reactor;
    introducing a process gas into the chamber;
    establishing a predetermined set of process conditions including chamber pressure and flow rates of constituents of the process gas;
    simultaneously coupling HF power and VHF power to the wafer while applying RF coil power to a coil antenna overlying a ceiling of the chamber facing the wafer;
    setting the levels of said HF power, said VHF power and said RF coil power to respective optimum levels at which a first process parameter is at a first target value and a second process parameter is at a second target value, said first and second process parameters comprising either: (a) plasma ion density in the chamber and plasma ion energy at the wafer surface, respectively, or (b) etch rate and critical dimension, respectively;
    wherein placing the production wafer on the wafer support is preceded by finding said optimum levels of said HF power and VHF power, and wherein finding said optimum levels comprises:
    processing a set of test wafers under said predetermined process conditions in a plasma reactor, and, during the processing of each different one of said test wafers, simultaneously coupling VHF and HF power to the one test wafer while applying RF coil power to a coil antenna overlying a ceiling of the reactor, and setting said VHF power, HF power and RF coil power to respective levels during processing of respective ones of said test wafers;

determining respective levels of the first process parameter during processing of respective ones of said test wafers, and correlating said respective levels of the first process parameter with corresponding levels of HF power, VHF power and RF coil power to produce a first array of data correlating each triplet of VHF, HF and RF coil power levels to a respective first process parameter value;

searching said first array of data for a constant first parameter set of VHF, HE and RF coil power level triplets at which the first process parameter is at or at least nearly at the first target value, corresponding to a first surface in VHF-HF-RF coil power space having a constant first parameter value; and finding one or more optimum VHF, HF and RF coil power level triplets in said constant density set at which the second process parameter is at or at least nearly at the second target value.

8. The method of claim 7 wherein finding the optimum VHF and HF power level pair comprises:

determining the value of the second process parameter for test wafers processed at VHF-HF-RF coil power level triplets in said first array of data, and searching said first array of data for a VHF-HF-RF coil power level pair at which the second process parameter is closest to the second target value.

9. The method of claim 7 wherein said method comprises a plasma etch process and said process gas comprises etchant species.

10. The method of claim 7 wherein said method comprises a plasma etch process for defining a polysilicon gate, and said process gas comprises precursors of species that etch polysilicon.

11. The method of claim 7 wherein applying RF coil power to a coil antenna comprises apportioning the RF coil power among inner and outer concentric coil antennas overlying the ceiling.

12. The method of claim 7 wherein said method comprises an etch process for defining a polysilicon gate, and said first parameter is etch rate, said second parameter is critical dimension at the bottom of a gate.

13. The method of claim 12 wherein said first target value is 670 Å/minute and said second target value is about 81 nm.

14. The method of claim 7 wherein finding the one or more optimum VHF, HF and RF coil power level triplets comprises:

determining respective levels of the second process parameter during processing of respective ones of said test wafers, and correlating said respective levels of energy with corresponding levels of VHF, HF and RF coil power to produce a second array of data correlating each VHF, HF and RF coil power level triplet to a second process parameter value;

searching said second array of data for a constant second process parameter set of VHF, HF and RF coil power level triplets at which the second process parameter is at or at least nearly at the second target value, corresponding to a second surface in VHF-HF-RF coil power space having a constant second parameter value; and searching said constant first parameter and constant second parameter sets of VHF, HF and RF coil power level triplets for a coincidence at which both the first and second target levels are fulfilled simultaneously, corresponding to an intersection of said first and second surfaces in VHF-HF-RF coil power space.

15. The method of claim 14 wherein said first and second process parameters are plasma ion density in the chamber and plasma ion energy at the wafer surface, and determining their levels comprises performing measurements of plasma conditions during processing of the respective test wafers.

16. The method of claim 14 wherein said first and second process parameters are etch rate and critical dimension, and determining their levels comprises performing measurements on the respective test wafers after processing of each test wafer.

17. The method of claim 14 wherein said intersection defines plural VHF, HF and RF coil power level triplets, said process further comprising choosing one of said triplets of VHF, HF and RF coil power level for processing the production wafer.

* * * * *